(12) United States Patent
Tien et al.

(10) Patent No.: US 9,799,558 B2
(45) Date of Patent: Oct. 24, 2017

(54) METHOD FOR FORMING CONDUCTIVE STRUCTURE IN SEMICONDUCTOR STRUCTURE

(71) Applicant: Taiwan Semiconductor Manufacturing Co., Ltd., Hsinchu (TW)

(72) Inventors: Hsi-Wen Tien, Xinfeng Township, Hsinchu County (TW); Carlos H. Diaz, Mountain View, CA (US); Chung-Ju Lee, Hsinchu (TW); Shau-Lin Shue, Hsinchu (TW); Tien-I Bao, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/942,386

(22) Filed: Nov. 16, 2015

(65) Prior Publication Data
US 2017/0140982 A1    May 18, 2017

(51) Int. Cl.
| H01L 21/768 | (2006.01) |
| H01L 21/311 | (2006.01) |
| H01L 21/288 | (2006.01) |
| H01L 21/3105 | (2006.01) |

(Continued)

(52) U.S. Cl.
CPC ........ *H01L 21/7688* (2013.01); *H01L 21/288* (2013.01); *H01L 21/31051* (2013.01); *H01L 21/31111* (2013.01); *H01L 21/76802* (2013.01); *H01L 21/76808* (2013.01); *H01L 21/76831* (2013.01); *H01L 21/76834* (2013.01); *H01L 21/76877* (2013.01); *H01L 21/76885* (2013.01);
(Continued)

(58) Field of Classification Search
CPC ........... H01L 21/76885; H01L 21/7688; H01L 27/76877; H01L 21/76877; H01L 21/76807; H01L 21/76831; H01L 21/76808
See application file for complete search history.

(56) References Cited

U.S. PATENT DOCUMENTS

| 9,142,453 | B1 * | 9/2015 | Chiu | H01L 21/76844 |
| 9,202,744 | B1 * | 12/2015 | Ban | H01L 21/76808 |
| 9,252,051 | B1 * | 2/2016 | Lee | H01L 21/76819 |

(Continued)

OTHER PUBLICATIONS

Murakami et al., "Spin-on Cu films for ultralarge scale integrated metallization", Journal of Vacuum Science & Technology B 17, pp. 2321-2324, published 1999.*

*Primary Examiner* — Daniel Luke
(74) *Attorney, Agent, or Firm* — Birch, Stewart, Kolasch & Birch, LLP (57) ABSTRACT

A method for manufacturing a semiconductor structure is provided. The method includes forming a first dielectric layer over a substrate and forming a sacrificial layer over the first dielectric layer. The method further includes forming an opening in the sacrificial layer and etching the first dielectric layer to form a via hole through the opening. The method further includes forming a conductive structure in the via hole and the opening and removing the sacrificial layer to expose an upper portion of the conductive structure. The method further includes forming a second dielectric layer around the upper portion of the conductive material.

20 Claims, 8 Drawing Sheets

(51) Int. Cl.
*H01L 23/522* (2006.01)
*H01L 23/532* (2006.01)

(52) U.S. Cl.
CPC .... *H01L 23/5226* (2013.01); *H01L 23/53228* (2013.01)

(56) References Cited

U.S. PATENT DOCUMENTS

| | | | | |
|---|---|---|---|---|
| 2007/0105362 | A1* | 5/2007 | Kim | H01L 21/31144 438/618 |
| 2008/0124912 | A1* | 5/2008 | Liu | H01L 21/28273 438/622 |
| 2012/0252206 | A1* | 10/2012 | Naik | H01L 29/66583 438/653 |
| 2012/0319278 | A1 | 12/2012 | Lin et al. | |
| 2013/0161798 | A1* | 6/2013 | Tomizawa | H01L 21/02063 257/635 |
| 2014/0091477 | A1 | 4/2014 | Wu et al. | |
| 2014/0273434 | A1 | 9/2014 | Peng et al. | |
| 2015/0104938 | A1* | 4/2015 | Tao | H01L 21/76811 438/666 |
| 2015/0262875 | A1* | 9/2015 | Xu | H01L 21/76879 257/774 |

* cited by examiner

METHOD FOR FORMING CONDUCTIVE STRUCTURE IN SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Although existing processes for manufacturing semiconductor structures have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A to 1K are cross-sectional representations of various stages of forming a semiconductor structure in accordance with some embodiments.

FIGS. 2A to 2C are cross-sectional representations of various stages of forming a semiconductor structure in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided. The semiconductor structure includes a conductive structure formed in a dielectric layer. In addition, during the formation of the semiconductor structure, a sacrificial layer is formed to prevent damaging the dielectric layer.

Figure 1A:
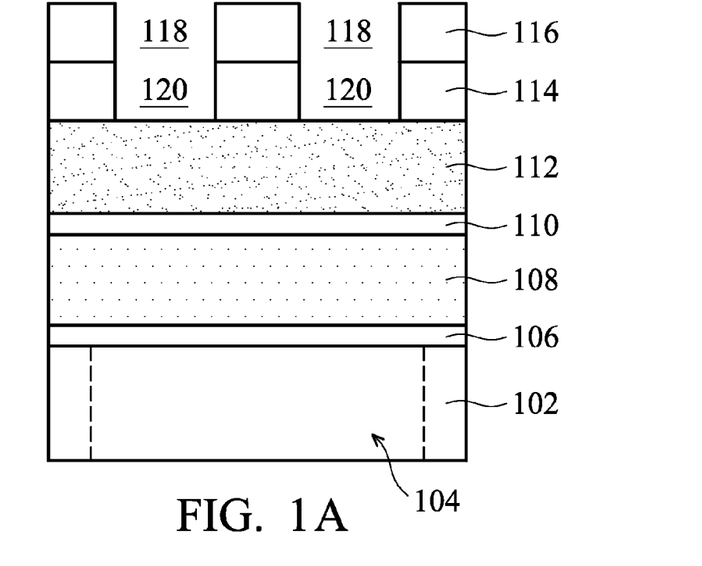

FIGS. 1A to 1K are cross-sectional representations of various stages of forming a semiconductor structure 100 in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region 104, as shown in FIG. 1A. The device region 104 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

A first etch stop layer 106 is formed over the substrate 102, as shown in FIG. 1A in accordance with some embodiments. In some embodiments, the first etch stop layer 106 is made of silicon nitride, silicon oxynitride, and/or other applicable materials. In some embodiments, the first etch stop layer 106 is formed by performing a plasma enhanced chemical vapor deposition (CVD) process, a low pressure CVD process, an atomic layer deposition (ALD) process, or other applicable processes. In some embodiments, the first etch stop layer 106 has a thickness in a range from about 50 Å to about 70 Å.

After the first etch stop layer 106 is formed, a first dielectric layer 108 is formed over the first etch stop layer 106, as shown in FIG. 1A in accordance with some embodiments. In some embodiments, the first dielectric layer 108 is an interlayer dielectric layer or an intermetal dielectric layer. The first dielectric layer 108 may include multilayers made of multiple dielectric materials, such as a low dielectric constant or an extreme low dielectric constant (ELK) material. In some embodiments, the first dielectric layer 108 is made of low-k dielectric materials. In some embodiments, the first dielectric layer 108 is made of silicon oxide, silicon nitride, silicon oxynitride, phosphosilicate glass (PSG), borophosphosilicate glass (BPSG), and/or other applicable low-k dielectric materials. In some embodiments, the first dielectric layer 108 is formed by performing a chemical vapor deposition (CVD) process, a physical vapor deposition (PVD) process, an atomic layer deposition (ALD) process, a spin-on coating process, or other applicable processes. In some embodiments, the first dielectric layer 108 has a thickness in a range from about 200 Å to about 350 Å.

After the first dielectric layer 108 is formed, a second etch stop layer 110 is formed over the first dielectric layer 108, as shown in FIG. 1A in accordance with some embodiments. In some embodiments, the second etch stop layer 110 is made of silicon nitride, silicon oxynitride, and/or other applicable materials. In some embodiments, the second etch stop layer 110 is formed by performing a plasma enhanced chemical vapor deposition (CVD) process, a low pressure CVD process, an atomic layer deposition (ALD) process, or other applicable processes. In some embodiments, the first etch stop layer 110 has a thickness in a range from about 30 Å to about 50 Å.

Next, a sacrificial layer 112 is formed over the second etch stop layer 110, as shown in FIG. 1A in accordance with some embodiments. In some embodiments, the sacrificial layer 112 is made of a carbon-based material. In some embodiments, the sacrificial layer 112 is made of amorphous carbon. In some embodiments, the sacrificial layer 112 is formed by performing a chemical vapor deposition (CVD) process, a physical vapor deposition (PVD) process, an atomic layer deposition (ALD) process, or other applicable processes.

In some embodiments, the thickness of the sacrificial layer 112 is greater than the thickness of the first dielectric layer 108. In some embodiments, the sacrificial layer 112 has a thickness in a range from about 450 Å to about 500 Å. The sacrificial layer 112 should be thick enough, or the conductive structure formed in the sacrificial layer 112 in subsequent processes may not be thick enough. On the other hand, the sacrificial layer 112 cannot be too thick, or the conductive structure formed in the subsequent process may bend or wiggle.

After the sacrificial layer 112 is formed, a hard mask layer 114 is formed over the sacrificial layer 112, and a photoresist layer 116 is formed over the hard mask layer 114, as shown in FIG. 1A in accordance with some embodiments. As shown in FIG. 1A, photoresist layer 116 has openings 118, and the hard mask layer 114 is patterned through the openings 118 of the photoresist layer 116, so that openings 120 are formed in the hard mask layer 114.

Figure 1B:
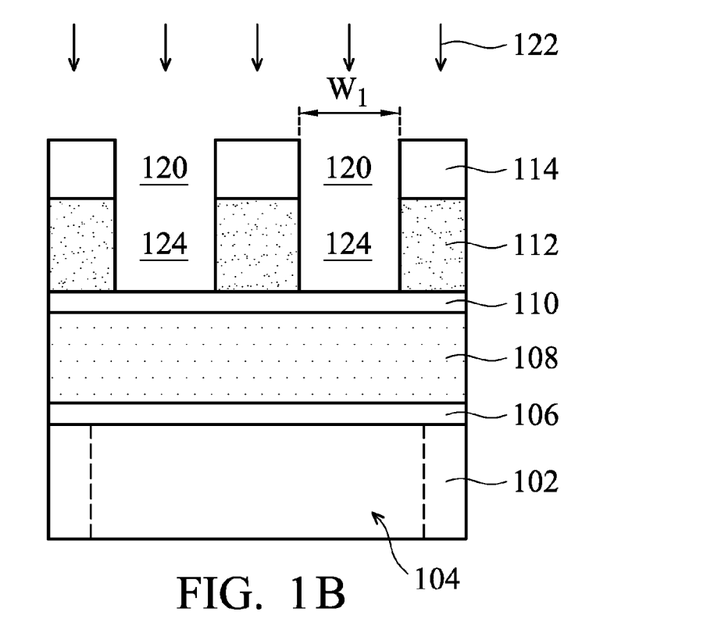

Afterwards, the sacrificial layer 112 is etched through the openings 120 of the hard mask layer 114 by performing an etching process 122, as shown in FIG. 1B in accordance with some embodiments. In some embodiments, the sacrificial layer 112 is etched by performing a dry etching process, and the dry etching process stops when the second etch stop layer 110 is exposed. After the etching process 122 is performed, openings 124 are formed in the sacrificial layer 112, as shown in FIG. 1B in accordance with some embodiments. In some embodiments, the opening 124 has a width $W_1$ in a range from about 13 nm to about 20 nm.

Figure 1C:
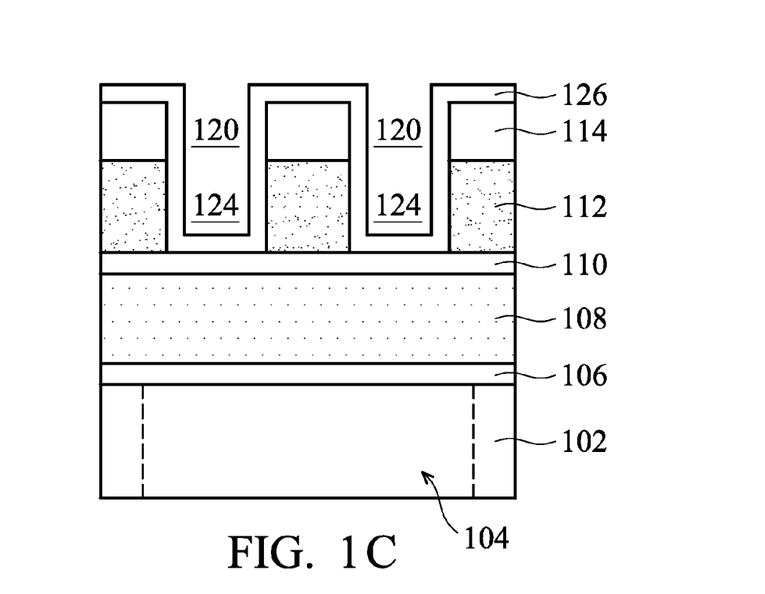

After openings 124 are formed, a spacer layer 126 is formed over substrate 102 in accordance with some embodiments. As shown in FIG. 1C, the spacer layer 126 is formed lining the opening 124 of the sacrificial layer 112. That is, the spacer layer 126 is formed over the sidewalls and the bottom surface of the openings 124.

Figure 1D:
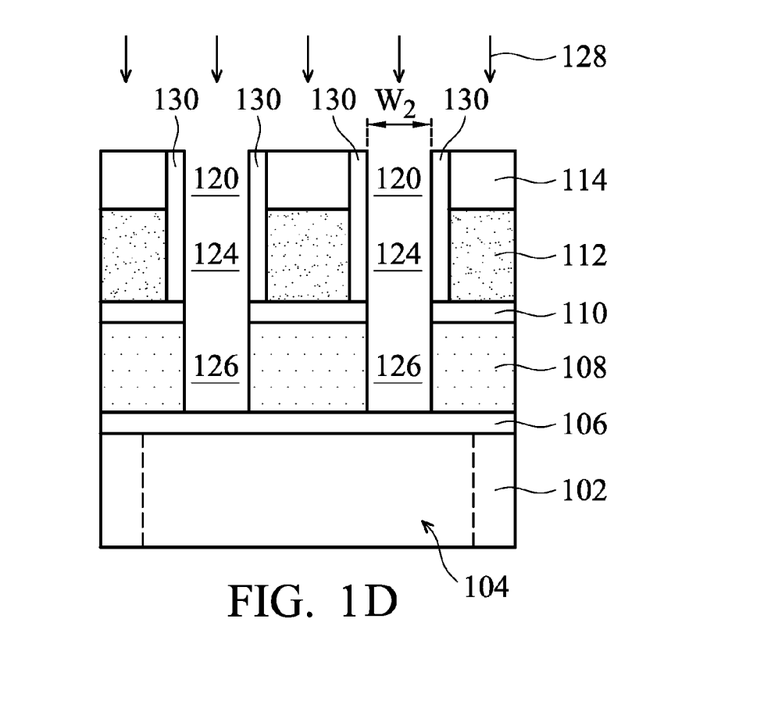

After the spacer layer 126 is formed, via holes 126 are formed in the first dielectric layer 108, as shown in FIG. 1D in accordance with some embodiments. In some embodiments, the formation of the via holes 126 includes performing an etching process 128. In some embodiments, the etching process 128 is a dry etching process. During the etching process 128, portions of the second etch stop layer 110 and the first dielectric layer 108 are etched through the openings 124, and the etching process 128 stops when the first etch stop layer 106 is exposed.

In addition, spacers 130 are formed on the sidewalls of sacrificial layer 112 and the sidewalls of hard mask layer 114 that are exposed by the openings 124 and 120 respectively, as shown in FIG. 1D in accordance with some embodiments. The spacers 130 are configured to protect the sacrificial layer 112 from being etched further during the etching process 128. Therefore, the size of the openings 124 formed in the sacrificial layer 112 will not be enlarged during the etching process 128 in accordance with some embodiments.

In addition, since the spacers are formed on the sidewalls of the openings 124, the width $W_2$ of the via hole 126 in the first dielectric layer 108 is smaller than the width $W_1$ of the opening 124 in the sacrificial layer 112. In some embodiments, a difference between the width $W_1$ of the opening 124 and the width $W_2$ of the via hole 126 is in a range of about 2 nm to about 6 nm. In some embodiments, the width $W_2$ of the via hole 126 is in a range from about 7 nm to about 18 nm. By forming the sacrificial layer 112, the width $W_1$ and the width $W_2$ may be relatively low, and the amount of conductive structures formed in a given area may be increased (Details will be described later.)

Figure 1E:
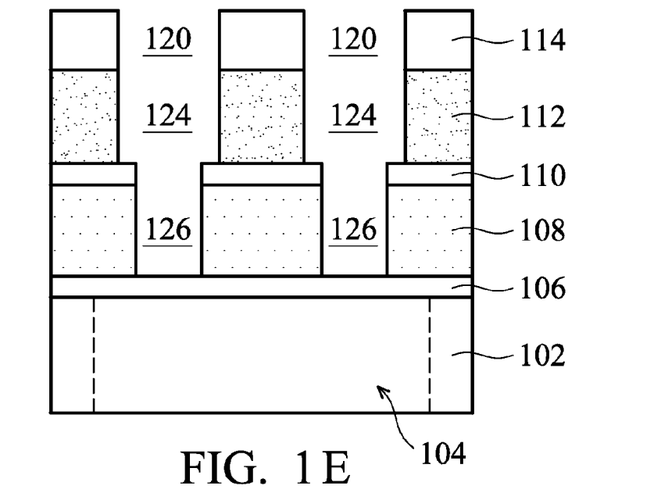
Figure 1F:
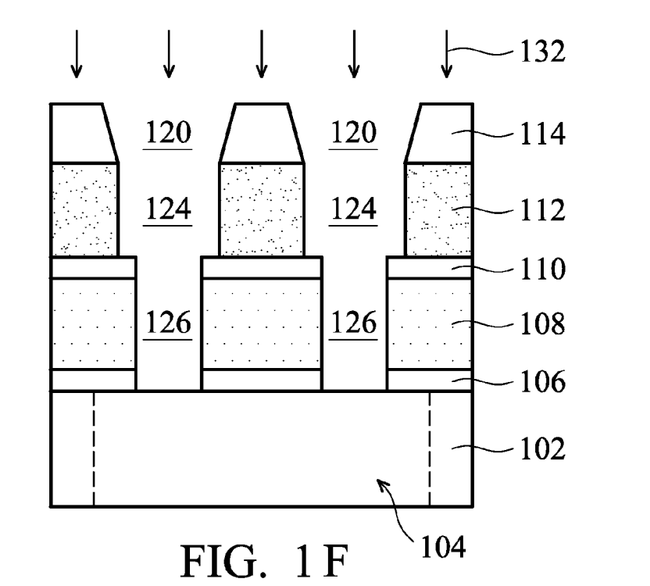

After the via holes 126 are formed, the spacers 130 are removed, as shown in FIG. 1E in accordance with some embodiments. The spacers 130 may be removed by performing a wet etching process. Next, an etching process 132 is performed. During the etching process 132, the portions of the first etch stop layer 106 exposed by the via holes 126 are removed, as shown in FIG. 1F in accordance with some embodiments. Accordingly, portions of the top surface of substrate 102 are exposed through the via holes 126. It should be noted that, although not shown in FIG. 1F, conductive features formed in the device region 104 in the substrate 102 may be exposed by the via holes 126. As shown in FIGS. 1D and 1F, the first dielectric layer 108 and the first etch stop layer 106 are etched separately by performing the etching processes 128 and 132 respectively. Therefore, the risk of damaging the conductive features formed in the device region 104 due to the loading effect may be reduced.

In addition, the corners of the hard mask layer 114 are also etched during the etching process 132, as shown in FIG. 1F in accordance with some embodiments. Accordingly, the openings 120 in the hard mask layer 114 are enlarged.

Figure 1G:
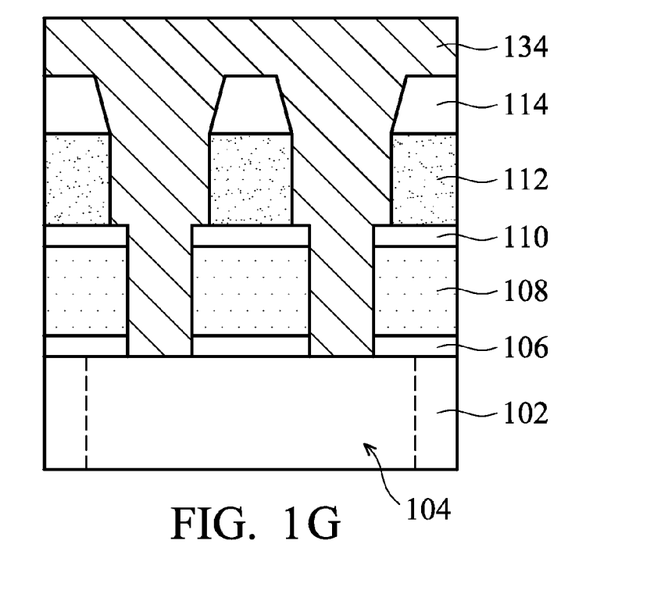

Next, a conductive material 134 is formed to fill in the via holes 126, the openings 124, and the openings 120, as shown in FIG. 1G in accordance with some embodiments. In addition, the conductive material 134 is also formed over the hard mask layer 114. As described previously, the corners of the hard mask layer 114 are etched to enlarge the openings 120. Therefore, the deposition of the conductive material 134 may become easier due to the larger openings 120.

In some embodiments, the conductive material 134 is copper. In some embodiments, the conductive material 134 is aluminum, copper, tungsten, titanium, tantulum, titanium nitride, tantalum nitride, nickel silicide, cobalt silicide, TaC, TaSiN, TaCN, TiAl, TiAlN, or other applicable materials.

In some embodiments, the conductive material 134 is formed by performing a spin-on coating process, a CVD process, a PVD process, or other applicable deposition or coating processes. As described previously, in some embodiments, the widths $W_1$ and $W_2$ are relatively small, and therefore a spin-on coating process may be performed to let the via holes 126 and the openings 124 fully filled with the conductive material 134.

Figure 1H:
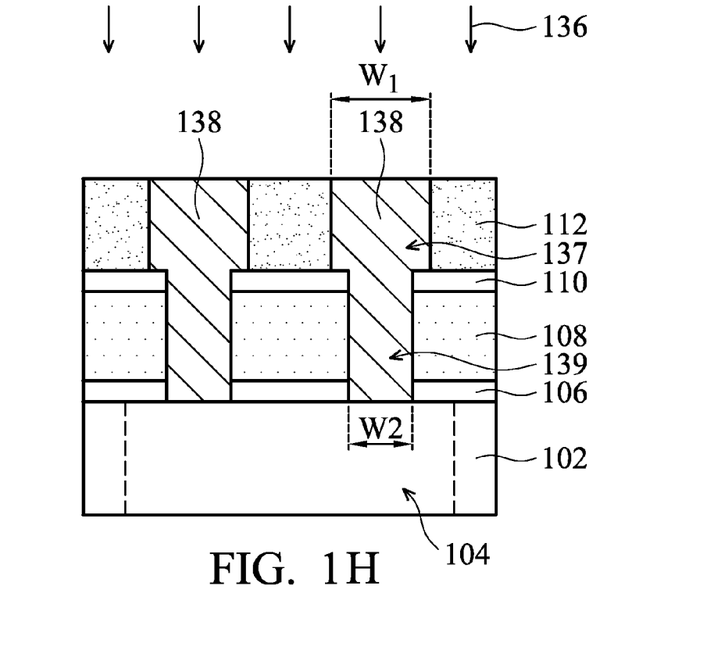

After the conductive material 134 is formed, a polishing process 136 is performed over the substrate 102, as shown in FIG. 1H in accordance with some embodiments. In some embodiments, the polishing process 136 is a chemical mechanical polishing process. In some embodiments, the polishing process 136 is performed until the top surface of sacrificial layer 112 is exposed. In some embodiments, the top portions of sacrificial layer 112 are also removed during the polishing process 136. After the polishing process 136 is performed, a conductive structure 138 is formed.

As shown in FIG. 1H, the conductive structure 136 includes an upper portion 137 and a lower portion 139. The upper portion 137 of conductive structure 136 is formed in the opening 124 in the sacrificial layer 112, and the lower portion 139 of conductive structure 136 is formed in the via hole 136 in the first dielectric layer 108. That is, the upper portion 137 of the conductive structure 136 is surrounded by the sacrificial layer 112, and the lower portion 139 of the conductive structure 136 is surrounded by the first dielectric layer 108. In some embodiments, the upper portion 137 formed in the sacrificial layer 112 can be seen as a metal line, and the lower portion 139 formed in the first dielectric layer 108 can be seen as a via.

In some embodiments, the upper portion 137 of conductive structure 138 has a width substantially equal to the width $W_1$ of opening 124, the lower portion 139 of the conductive structure 138 has a width substantially equal to the width $W_2$ of the via hole 126. As described previously, the via holes 126 are formed after the spacers 130 are formed on the sidewalls of the openings 124. Therefore, the width $W_2$ of the lower portion 139 is smaller than the width $W_1$ of the upper portion 137 in accordance with some embodiments.

Figure 1I:
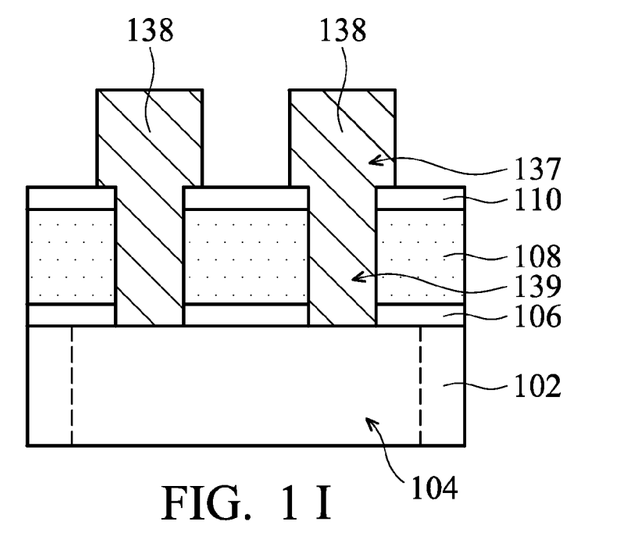

Next, the sacrificial layer 112 is removed, as shown in FIG. 1I in accordance with some embodiments. In some embodiments, the sacrificial layer 112 is removed by a dry etching process. As described previously, the sacrificial layer 112 is made of a carbon-based material, such as amorphous carbon, which has a great etching selectivity with the conductive structure 138 and the second etch stop layer 110. Therefore, the sacrificial layer 112 may be removed by a dry etching process without damaging the conductive structure 138 and the second etch stop layer 110. In some embodiments, the etching rate of sacrificial layer 112 to the etching rate of the conductive structure 138 and the second etch stop layer 110 is greater than 30.

Figure 1J:
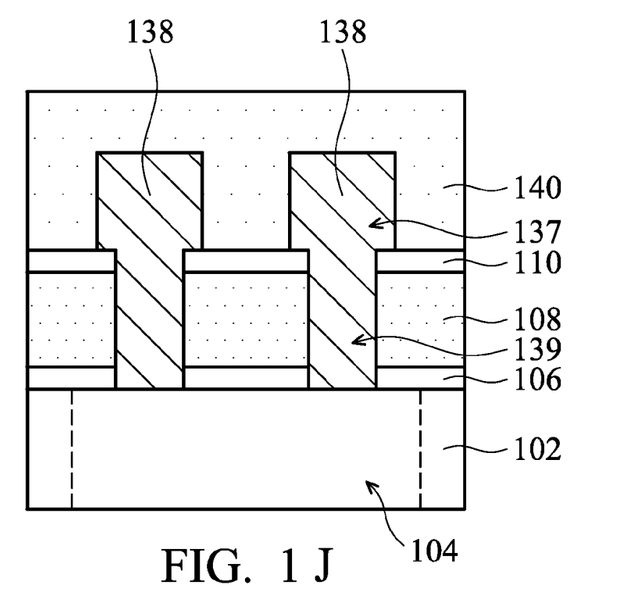

As shown in FIG. 1I, after the sacrificial layer 112 is removed, the upper portion 137 of conductive structure 138 is exposed. Next, a second dielectric layer 140 is formed over the substrate 102, as shown in FIG. 1J in accordance with some embodiments. As shown in FIG. 1J, the second dielectric layer 140 is formed around the upper portion of conductive structure 138 and covers the conductive structure 138 and the second etch stop layer 110. In some embodiments, the second dielectric layer 140 is made of low-k dielectric materials. In some embodiments, the second dielectric layer 140 is made of silicon oxide, silicon nitride, silicon oxynitride, phosphosilicate glass (PSG), borophosphosilicate glass (BPSG), and/or other applicable low-k dielectric materials. In some embodiments, the second dielectric layer 140 is formed by performing a chemical vapor deposition (CVD) process, a physical vapor deposition (PVD) process, an atomic layer deposition (ALD) process, a spin-on coating process, or other applicable processes.

Figure 1K:
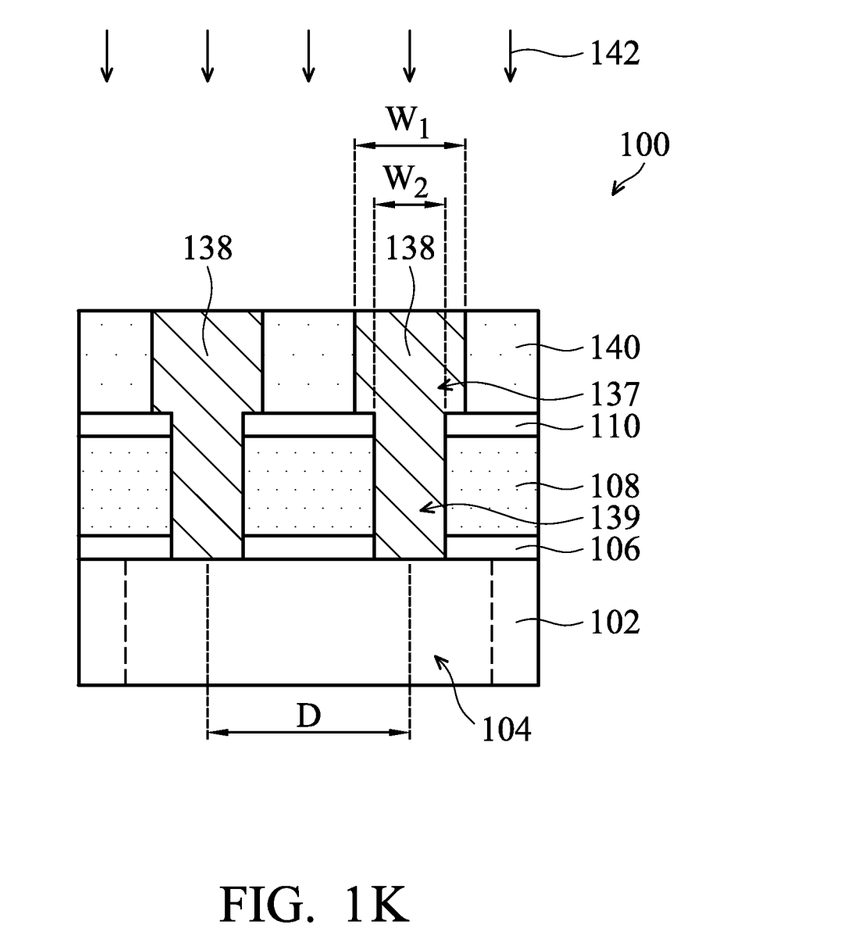

Next, a polishing process 142 is performed on the second dielectric layer 140, as shown in FIG. 1K in accordance with some embodiments. In some embodiments, the polishing process 142 is a chemical mechanical polishing process. In some embodiments, the polishing process 142 is performed until the top surface of conductive structure 138 is exposed. In some embodiments, the top portions of conductive structure 138 are removed during the polishing process 142. In some embodiments, the second dielectric layer 140 has a thickness in a range from about 300 Å to about 350 Å.

As described previously, the sacrificial layer 112 is formed first and then replaced by the second dielectric layer 140 afterwards. In addition, before the second dielectric layer 140 is formed, polishing processes are performed (e.g., in the polishing process 136) Therefore, the thickness of the sacrificial layer 112 is greater than the thickness of the second dielectric layer 140. Therefore, the sacrificial layer 112 should be thick enough so that the thickness of the second dielectric layer 140 can be thick enough in accordance with some embodiments.

As shown in FIG. 1K, the semiconductor structure 100 is formed in accordance with some embodiments. The conductive structure 138 in the semiconductor structure 100 has the upper portion 137 and the lower portion 139, and the upper portion 137 is located in the second dielectric layer 140 and the lower portion 139 is located in the first dielectric layer 139. As described previously, the upper portion 137 is formed in the sacrificial layer 112, and the sacrificial layer 112 is replaced by the second dielectric layer 140 afterwards. That is, the second dielectric layer 140 is not damaged by the processes for forming the conductive structures 138 (e.g. the etching process 122, the process used to remove the photoresist layer 116, and/or the process used to remove the spacers 130).

Furthermore, since the second dielectric layer 140 will not be damaged due to the etching processes used during the manufacturing processes, the conductive structure 138 can have a relatively small width (e.g. the width $W_1$ and $W_2$). In addition, the distance D between the center points of two adjacent conductive structures 138 may also be relatively small. In some embodiments, the distance D between the center points of two adjacent conductive structures 138 is in a range from about 26 nm to about 40 nm.

In addition, in some embodiments, the second dielectric layer 140 is made of low-k dielectric materials. Since the second dielectric layer 140 is not damaged by processes for forming the conductive structure 138, the dielectric constant of the second dielectric layer 140 can be as low as designed, and therefore the performance of the semiconductor structure 100 may be improved.

As described previously, although not shown in FIG. 1K, conductive features may be formed in the device region 104 in the substrate 102, and the conductive structures 138 may be electrically connected with the conductive features.

Figure 2A:
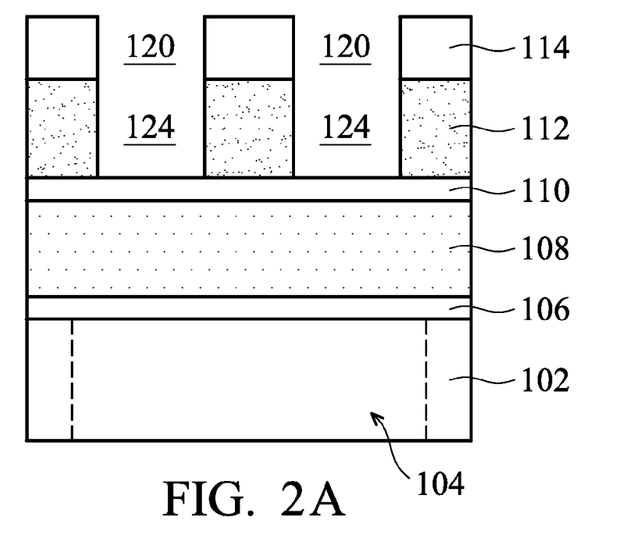
Figure 2B:
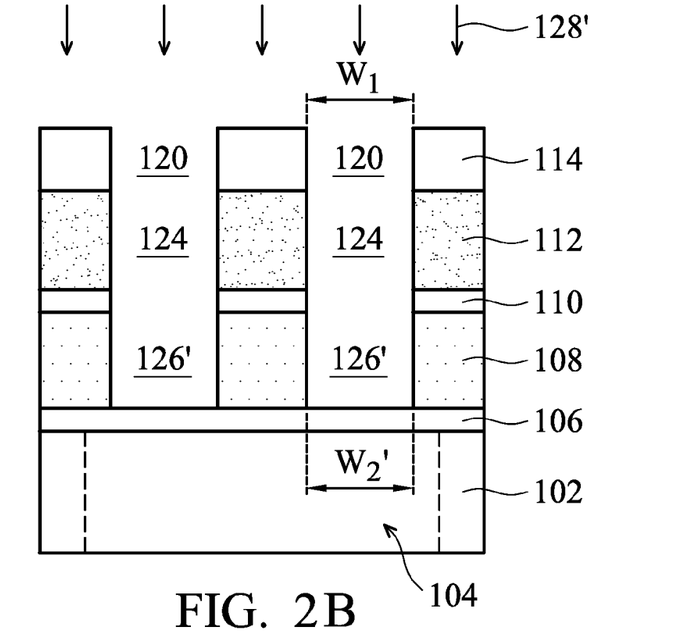
Figure 2C:
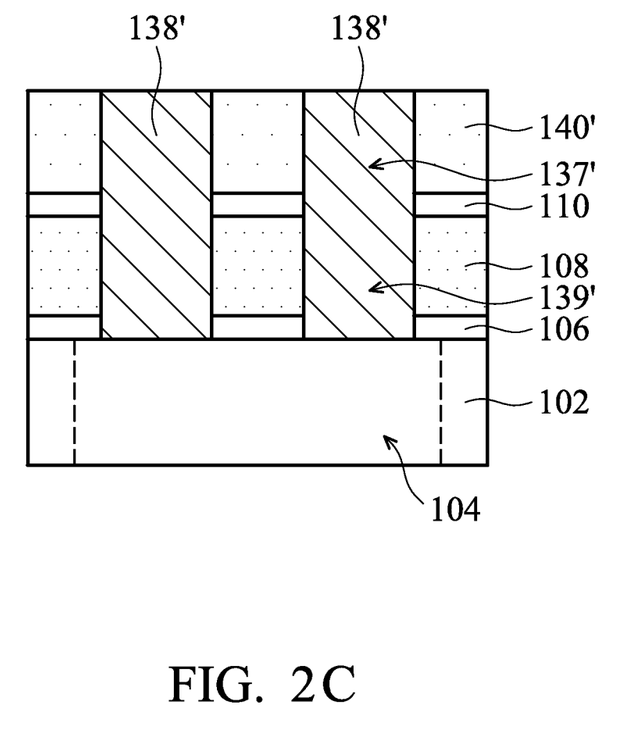

FIGS. 2A to 2C are cross-sectional representations of various stages of forming a semiconductor structure 100' in accordance with some embodiments. The semiconductor structure 100' is similar to, or the same as, the semiconductor structure 100 described previously, except the spacers 130 are not formed. Some materials and processes used to form the semiconductor structure 100' may be similar to, or the same as, those used to form the semiconductor structure 100 and are not repeated herein.

Processes shown in FIGS. 1A to 1B may be performed first. More specifically, the first etch stop layer 106, the first dielectric layer 108, the second etch stop layer 110, the sacrificial layer 112, and the hard mask layer 114 are formed over the substrate 102, as shown in FIG. 2A in accordance with some embodiments. In addition, openings 124 are formed in the sacrificial layer 112. After the openings 124 are formed in the sacrificial layer 112, via holes 126' are formed in the first dielectric layer 108, as shown in FIG. 2B in accordance with some embodiments. In some embodiments, the formation of the via holes 126' includes performing an etching process 128'. The etching process 128' may be a dry etching process.

As shown in FIG. 2B, no spacers are formed before the etching process 128' is performed, and therefore the resulting via holes 126' have a width $W_2'$ substantially equal to the width $W_1$ of the openings 124 formed in the sacrificial layer 112. After the via holes 126' are formed, processes similar to, or the same as, those shown in FIGS. 1G to 1K may be performed.

More specifically, a conductive structure 138' formed in the openings 120, the openings 124, and the via holes 126', and the conductive structure 138' has an upper portion 137' and a lower portion 139'. Afterwards, the sacrificial layer 112 is replaced by a second dielectric layer 140', as shown in FIG. 2C in accordance with some embodiments.

Similar to those of the semiconductor structure 100, although the upper portion 137' of conductive structure 138' in the semiconductor structure 100' passes through the second dielectric layer 140', the second dielectric layer 140' is not damaged by the processes for forming the conductive structure 138'. Accordingly, the dielectric constant of the second dielectric layer 140' can remain as designed, and the performance of the semiconductor structure 100' can be improved.

As shown in the embodiments described previously, during the formation of a semiconductor structure (e.g. the semiconductor structures 100 and 100'), a sacrificial layer (e.g. the sacrificial layer 112) is formed first and removed after a conductive structure (e.g. the conductive structures 138 and 138') is formed in the sacrificial layer. Afterwards, a second dielectric layer is formed around the conductive structure. That is, the second dielectric layer is formed after the conductive structure is formed. Accordingly, although the conductive structure is located in the second dielectric layer, the second dielectric layer is not damaged by the processes used to form the conductive structure. Therefore, the second dielectric layer, such as made of a low-k dielectric layer, may keep its properties as designed, and the performance of the semiconductor structure will not be undermined due to damage to the dielectric layer. For example, the second dielectric layer may maintain a low-k value, and therefore the resistance and the capacitance of the semiconductor structure may be reduced.

Furthermore, the sacrificial layer is made of a carbon-based material, such as amorphous carbon in accordance with some embodiments. Therefore, the sacrificial layer may have relatively high etching selectivity with the structures formed around it and can be removed easily. In addition, the sacrificial layer may be formed to have a greater height (compared to the second dielectric layer formed afterwards), so that the height of the second dielectric layer can still be thick enough even if polishing processes (e.g. the polishing processes 136 and 142) are performed.

Embodiments of methods for forming a semiconductor structure are provided. The method includes forming a sacrificial layer over a substrate and forming a conductive structure in the sacrificial layer. After the conductive structure is formed, the sacrificial layer is replaced by a dielectric layer. Accordingly, although the conductive structure is located in the dielectric layer, the dielectric layer is not damaged by the processes which are used to form the conductive structure. Therefore, the capacitance of the semiconductor structure may be reduced, and the performance of the semiconductor structure may be improved.

In some embodiments, a method for manufacturing a semiconductor structure is provided. The method for manufacturing a semiconductor structure includes forming a first dielectric layer over a substrate and forming a sacrificial layer over the first dielectric layer. The method for manufacturing a semiconductor structure further includes forming an opening in the sacrificial layer and etching the first dielectric layer to form a via hole through the opening. The method for manufacturing a semiconductor structure further includes forming a conductive structure in the via hole and the opening and removing the sacrificial layer to expose an upper portion of the conductive structure. The method for manufacturing a semiconductor structure further includes forming a second dielectric layer around the upper portion of the conductive material.

In some embodiments, a method for manufacturing a semiconductor structure is provided. The method for manufacturing a semiconductor structure includes forming a sacrificial layer over a substrate. The method for manufacturing a semiconductor structure further includes forming an opening in the sacrificial layer and forming a conductive structure in the opening. The method for manufacturing a semiconductor structure further includes removing the sacrificial layer and coating a second dielectric layer over the substrate. In addition, the conductive structure is covered by the second dielectric layer. The method for manufacturing a semiconductor structure further includes polishing the second dielectric layer to expose a top surface of the conductive structure. In addition, the sacrificial layer is made of a carbon-based material.

In some embodiments, a method for manufacturing a semiconductor structure is provided. The method for manufacturing a semiconductor structure includes forming a first dielectric layer over a substrate and forming a sacrificial layer over the first dielectric layer. The method for manufacturing a semiconductor structure further includes forming an opening in the sacrificial layer and forming spacers on sidewalls of the opening. The method for manufacturing a semiconductor structure further includes etching the first dielectric layer to form a via hole through the opening and removing the spacers. The method for manufacturing a semiconductor structure further includes forming a conductive structure in the via hole and in the opening and removing the sacrificial layer to expose an upper portion of the conductive structure. The method for manufacturing a semiconductor structure further includes forming a second dielectric layer around the upper portion of the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first dielectric layer over a substrate;
    forming a sacrificial layer over the first dielectric layer;
    forming a mask layer over the sacrificial layer;
    forming an opening in the sacrificial layer;
    forming a spacer layer lining the opening of the sacrificial layer, so that sidewalls of the sacrificial layer and a top surface of the first dielectric layer is covered by the spacer layer;
    etching the spacer layer and the first dielectric layer through the opening to form a via hole and to form spacers on the sidewalls of the sacrificial layer;
    removing corners of the mask layer;
    forming a conductive structure in the via hole and the opening after the corners of the mask layer are removed;
    removing the mask layer after the conductive structure is formed;
    removing the sacrificial layer to expose an upper portion of the conductive structure; and
    forming a second dielectric layer around the upper portion of the conductive material.

2. The method for manufacturing a semiconductor structure as claimed in claim 1, wherein the sacrificial layer is made of a carbon-based material.

3. The method for manufacturing a semiconductor structure as claimed in claim 1, wherein the sacrificial layer is made of amorphous carbon.

4. The method for manufacturing a semiconductor structure as claimed in claim 1, wherein the sacrificial layer has a thickness in a range from about 450 Å to about 500 Å.

5. The method for manufacturing a semiconductor structure as claimed in claim 1, further comprising:
    forming a first etch stop layer over the substrate before forming the first dielectric layer; and
    forming a second etch stop layer over the first dielectric layer before forming the sacrificial layer.

6. The method for manufacturing a semiconductor structure as claimed in claim 1, wherein the conductive structure is formed by performing a spin-on coating process.

7. A method for manufacturing an interconnect structure, comprising:
    forming a first etch stop layer over a substrate;
    forming a first dielectric layer over the first etch stop layer;
    forming a sacrificial layer over the first dielectric layer over a substrate;
    forming a mask layer over the sacrificial layer;
    forming an opening in the sacrificial layer;
    forming spacers on sidewalls of the sacrificial layer and on sidewalls of the mask layer;
    forming a via hole in the first dielectric layer;
    removing the spacers;
    performing an etching process to etch the first etch stop layer through the via hole and to remove corners of the mask layer;
    forming a conductive structure in the opening and in the via hole after the corners of the mask layer are removed;
    removing the sacrificial layer after the conductive structure is formed;
    coating a second dielectric layer over the substrate, wherein the conductive structure is covered by the second dielectric layer; and
    polishing the second dielectric layer to expose a top surface of the conductive structure, wherein the sacrificial layer is made of amorphous carbon.

8. The method for manufacturing a semiconductor structure as claimed in claim 7, wherein a thickness of the sacrificial layer is greater than a thickness of the second dielectric layer.

9. The method for manufacturing a semiconductor structure as claimed in claim 7, wherein the opening has a width in a range from about 13 nm to about 20 nm.

10. The method for manufacturing a semiconductor structure as claimed in claim 7, wherein the conductive structure is made of copper.

11. A method for manufacturing a semiconductor structure, comprising:
    forming a first dielectric layer over a substrate;
    forming a sacrificial layer over the first dielectric layer;
    forming a mask layer over the sacrificial layer;
    forming an opening in the sacrificial layer;
    forming a spacer layer on sidewalls of the sacrificial layer, sidewalls of the mask layer and a top surface of the first dielectric layer;
    etching the first dielectric layer and the spacer layer through the opening to form a via hole and to form spacers on the sidewalls of the sacrificial layer and the sidewalls of the mask layer;
    removing the spacers;
    forming a conductive structure in the via hole and in the opening;
    removing the mask layer and the sacrificial layer to expose an upper portion of the conductive structure;
    forming a second dielectric layer around the upper portion of the conductive structure,
    wherein the sacrificial layer is made of amorphous carbon.

12. The method for manufacturing a semiconductor structure as claimed in claim 11, further comprising:
    forming a first etch stop layer over the substrate before forming the first dielectric layer; and
    forming a second etch stop layer over the first dielectric layer before forming the sacrificial layer.

13. The method for manufacturing a semiconductor structure as claimed in claim 11, wherein a thickness of the sacrificial layer is greater than a thickness of the second dielectric layer.

14. The method for manufacturing a semiconductor structure as claimed in claim 11, wherein the opening has a width in a range from about 13 nm to about 20 nm.

15. The method for manufacturing a semiconductor structure as claimed in claim 11, wherein the sacrificial layer has a thickness in a range from about 450 Å to about 500 Å.

16. The method for manufacturing a semiconductor structure as claimed in claim 11, further comprising:
    removing corners of the mask layer before the conductive structure is formed.

17. The method for manufacturing a semiconductor structure as claimed in claim 1, wherein the via hole is formed by performing a first etching process, and the corners of the mask layer is removed by performing a second etching process after the first etching process is performed.

18. The method for manufacturing a semiconductor structure as claimed in claim 17, further comprising:
- forming a first etch stop layer over the substrate before the first dielectric layer is formed,
- wherein a portion of the first etch stop layer exposed by the via hole of the first dielectric layer is etched during the second etching process.

19. The method for manufacturing a semiconductor structure as claimed in claim 12, further comprising:
- performing an etching process before the conductive structure is formed, so that the first etch stop layer exposed by the via hole and corners of the mask layer are etched.

20. The method for manufacturing a semiconductor structure as claimed in claim 19, wherein the spacers are formed by etching the spacer layer located over the first dielectric layer.

\* \* \* \* \*